(12) United States Patent
Doglio et al.

(10) Patent No.: US 12,321,210 B2
(45) Date of Patent: Jun. 3, 2025

(54) SYSTEM FOR THERMAL MANAGEMENT OF A HANDHELD COMPUTING DEVICE

(71) Applicant: Dell Products L.P., Round Rock, TX (US)

(72) Inventors: Jean Marie Doglio, Round Rock, TX (US); Paul Roberto Lalinde, Spring, TX (US); Chen Mengwei, Taipei (TW); Chun-Min He, Taipei (TW); Yongook Guack, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 280 days.

(21) Appl. No.: 18/191,397

(22) Filed: Mar. 28, 2023

(65) Prior Publication Data

US 2024/0329703 A1 Oct. 3, 2024

(51) Int. Cl.
*G06F 1/20* (2006.01)
*G06F 1/16* (2006.01)
*H05K 7/20* (2006.01)

(52) U.S. Cl.
CPC ............ *G06F 1/203* (2013.01); *G06F 1/1632* (2013.01); *H05K 7/20145* (2013.01); *H05K 7/20172* (2013.01)

(58) Field of Classification Search
CPC .......... G06F 1/203; G06F 1/1632; G06F 1/20; G06F 2200/201; G06F 1/1616; G06F 1/206; H05K 7/20145; H05K 7/20172; H05K 7/20209
See application file for complete search history.

(56) References Cited

U.S. PATENT DOCUMENTS

| | | | | |
|---|---|---|---|---|
| 5,959,836 A | * | 9/1999 | Bhatia | G06F 1/203 361/679.48 |
| 6,239,970 B1 | * | 5/2001 | Nakai | G06F 1/166 174/15.1 |
| 6,522,535 B1 | * | 2/2003 | Helot | G06F 1/1632 361/679.48 |
| 6,837,058 B1 | * | 1/2005 | McEuen | G06F 1/203 361/679.48 |
| 8,000,099 B2 | * | 8/2011 | Parker | G06F 1/203 361/679.48 |
| 8,553,409 B2 | | 10/2013 | Rehmann et al. | |
| 8,926,414 B1 | * | 1/2015 | Kirkpatrick | G06F 1/203 361/679.41 |
| 10,191,522 B2 | | 1/2019 | Morrison et al. | |

(Continued)

*Primary Examiner* — Michael A Matey
(74) *Attorney, Agent, or Firm* — McDermott Will & Emery LLP (57) ABSTRACT

A system for thermal management of a handheld computing device, including: a docking station, including: a first air inlet; a first air outlet; a first fan; the handheld computing device that is removably coupled to the docking station, including: a primary air outlet; a secondary air outlet including a vent door; a primary air inlet; a secondary air inlet; a DOO fan; wherein when the handheld computing device is coupled to the docking station: the first fan moves i) air from the first air inlet to the first air outlet to the secondary air inlet and ii) from the secondary air inlet to the secondary air outlet, and the fan i) moves air from the primary air inlet to the primary air outlet and ii) circulates air about the handheld computing device and to the secondary air outlet.

20 Claims, 11 Drawing Sheets

(56) References Cited

U.S. PATENT DOCUMENTS

| | | |
|---|---|---|
| 11,092,986 B2 | 8/2021 | North et al. |
| 11,347,285 B2 * | 5/2022 | Casparian ............. G06F 1/1632 |
| 2002/0018335 A1 * | 2/2002 | Koizumi ................. G06F 1/203 |
| | | 361/679.47 |
| 2003/0128510 A1 * | 7/2003 | Anzai ....................... G06F 1/18 |
| | | 361/679.48 |
| 2006/0056151 A1 * | 3/2006 | Hara ................. H05K 7/20145 |
| | | 165/104.33 |
| 2013/0148298 A1 * | 6/2013 | Liu .................... H05K 7/20145 |
| | | 361/695 |
| 2014/0098486 A1 * | 4/2014 | Davis .................... G06F 1/1607 |
| | | 361/679.41 |
| 2017/0153678 A1 * | 6/2017 | Uchino ................. G06F 1/1632 |
| 2018/0014709 A1 * | 1/2018 | O'Brien ................ A47L 9/2884 |
| 2021/0191461 A1 * | 6/2021 | Jaggers ................... G06F 1/206 |
| 2021/0330157 A1 * | 10/2021 | Conrad ................... A47L 9/149 |

\* cited by examiner

SYSTEM FOR THERMAL MANAGEMENT OF A HANDHELD COMPUTING DEVICE

BACKGROUND

Field of the Disclosure

The disclosure relates generally to a system for thermal management of a handheld computing device.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a system for thermal management of a handheld computing device, including: a docking station, including: a first air inlet; a first air outlet; a first fan; the handheld computing device that is removably coupled to the docking station, including: a primary air outlet; a secondary air outlet; a primary air inlet; a secondary air inlet; a fan; wherein when the handheld computing device is decoupled from the docking station: the secondary air inlet is closed, and the fan i) moves air from the primary air inlet to the primary air outlet and ii) circulates air about the handheld computing device and to the secondary air outlet; wherein when the handheld computing device is coupled to the docking station: the secondary air inlet is open, the first fan moves i) air from the first air inlet to the first air outlet to the secondary air inlet and ii) from the secondary air inlet to the secondary air outlet, and the fan i) moves air from the primary air inlet to the primary air outlet and ii) circulates air about the handheld computing device and to the secondary air outlet.

Other embodiments of these aspects include corresponding systems and apparatus.

These and other embodiments may each optionally include one or more of the following features. For instance, when the handheld computing device is coupled to the docking station, the fan circulates the air about the handheld computing device and to the secondary air outlet in parallel with the first fan moving the air from the secondary air inlet to the secondary air outlet. When the handheld computing device is coupled to the docking station, the air circulated by the fan is combined with the air moved by the first fan from the secondary air inlet to the secondary air outlet. When the handheld computing device is coupled to the docking station, a pressure of the air moved by the first fan from the secondary air inlet to the secondary air outlet is greater than a pressure of the air that is circulated by the fan. The secondary air outlet of the handheld computing device further includes a vent door, wherein when the handheld computing device is decoupled from the docking station, the vent door is closed such that the secondary air inlet is closed, and wherein when the handheld computing device is coupled to the docking station, the vent door is open such that the secondary air inlet is open. The docking station further includes a guide pin and the handheld computing device further includes a linkage arm, wherein, when the handheld computing device is coupled to the docking station, the guide pin contacts the linkage arm to open the vent door. The linkage arm is coupled to the handheld computing device at a fixed shaft, and further coupled to the vent door at a pivot, wherein the linkage arm rotates about the fixed shaft. When the handheld computing device is coupled to the docking station, the guide pin contacts the linkage arm to rotate the linkage arm about the fixed shaft to open the vent door. When the linkage arm rotates about the fixed shaft, the linkage arm translates the vent door via the pivot to open the vent door. The handheld computing device further includes a spring, wherein, when the handheld computing device is decoupled to the docking station, the spring maintains the vent door closed. The fan is a dual opposite outlet (DOO) fan.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This disclosure discusses systems for thermal management of a handheld computing device. In short, a portable computing device can be coupled with a docking station. The portable computing device can include an internal fan, and the docking station can include a fan. When the portable computing device is coupled with the docking station, the fan of the docking station can be used in parallel with the fan of the portable computing device to boost cooling performance of the portable computing device. The portable computing device can include a vent door that can be opened when docked with the docking station to facilitate such cooling, and closed when undocked to facilitate circulation of air within the portable computing device.

Specifically, this disclosure discusses a system for thermal management of a handheld computing device, including: a docking station, including: a first air inlet; a first air outlet; a first fan; the handheld computing device that is removably coupled to the docking station, including: a primary air outlet; a secondary air outlet; a primary air inlet; a secondary air inlet; a DOO fan; wherein when the handheld computing device is decoupled from the docking station: the secondary air inlet is closed, and the fan i) moves air from the primary air inlet to the primary air outlet and ii) circulates air about the handheld computing device and to the secondary air outlet; wherein when the handheld computing device is coupled to the docking station: the secondary air inlet is open, the first fan moves i) air from the first air inlet to the first air outlet to the secondary air inlet and ii) from the secondary air inlet to the secondary air outlet, and the fan i) moves air from the primary air inlet to the primary air outlet and ii) circulates air about the handheld computing device and to the secondary air outlet.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-11 wherein like numbers are used to indicate like and corresponding parts.

Figure 1:
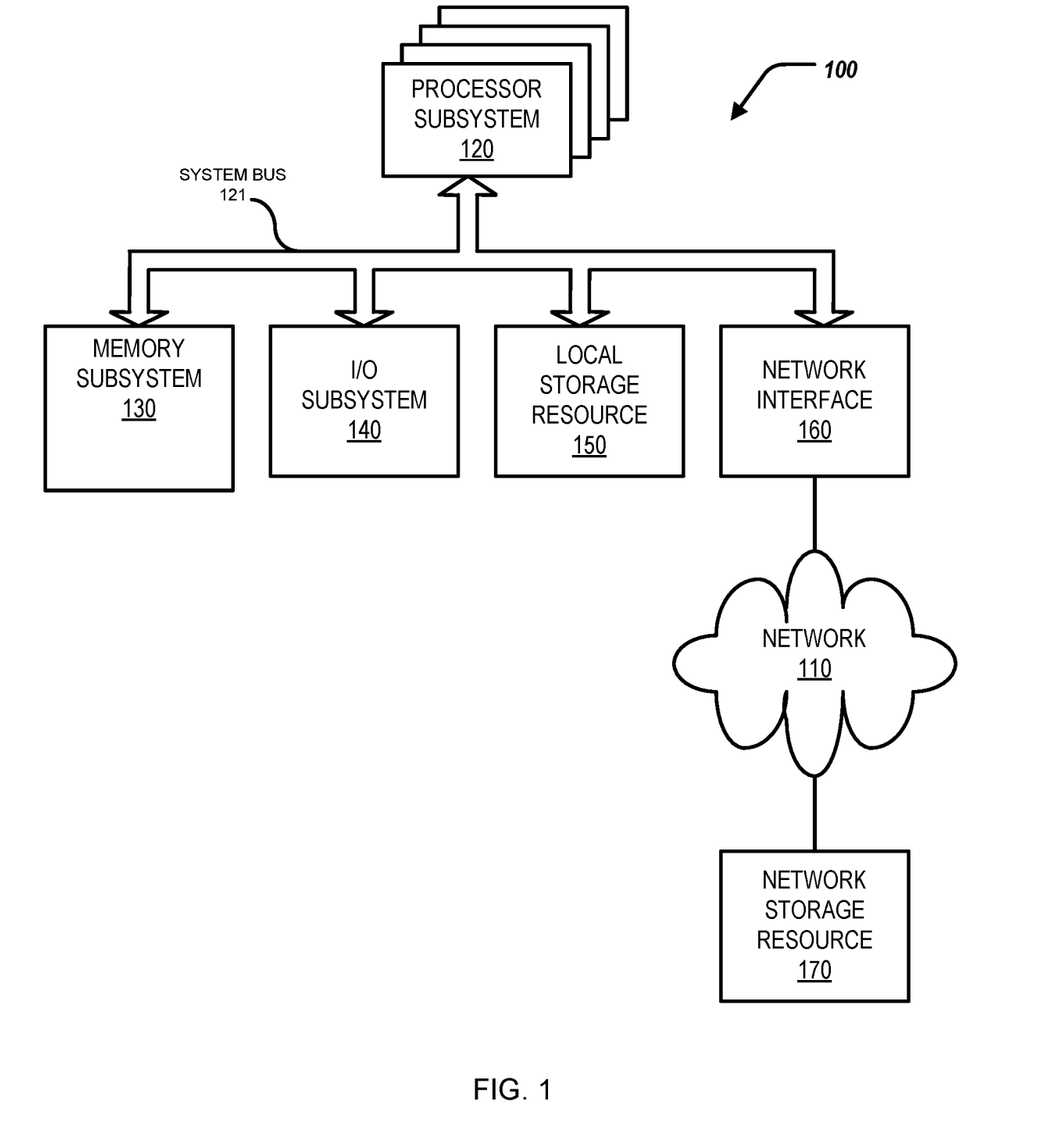
FIG. 1 is a block diagram of selected elements of an embodiment of an information handling system.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

In short, the information handling system 100 may be a portable computing device (such as a portable gaming system). The portable computing device can be coupled with a docking station. The portable computing device can include an internal fan, and the docking station can include a fan. When the portable computing device is coupled with the docking station, the fan of the docking station can be used in parallel with the fan of the portable computing device to boost cooling performance of the portable computing device. The portable computing device can include a vent door that can be opened when docked with the docking station to facilitate such cooling, and closed when undocked to facilitate circulation of air within the portable computing device.

Figure 2:
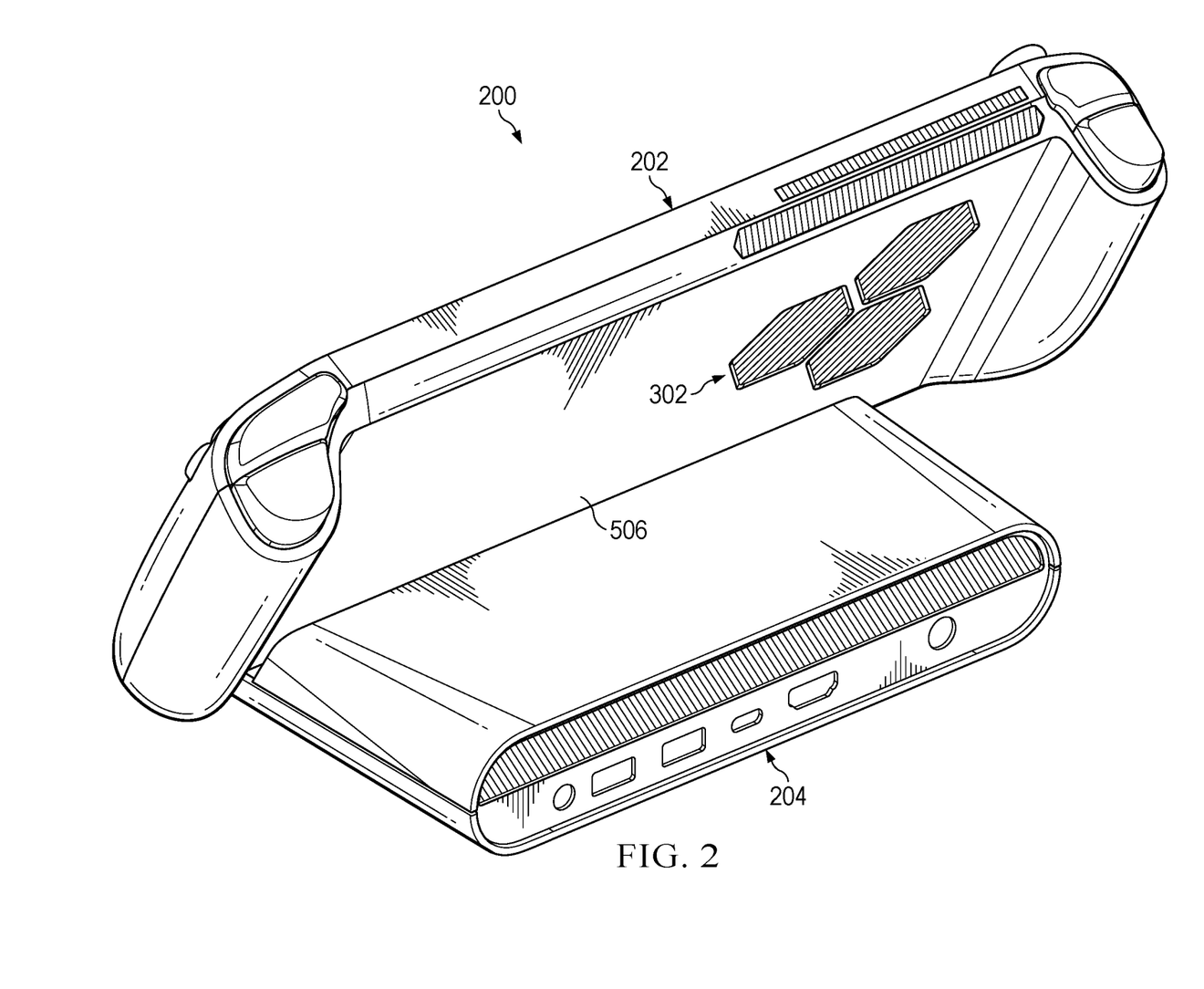
FIG. 2 illustrates a top down perspective view of an environment including a handheld computing device and a docking station.

Turning to FIG. 2, FIG. 2 illustrates a top down perspective view of an environment 200 including a handheld computing device 202 and a docking station 204. As shown, the handheld computing device 202 is docked with, or coupled within, the docking station 204. The handheld computing device 204 can be similar to, or include, the information handling system 100 of FIG. 1.

Figure 3:
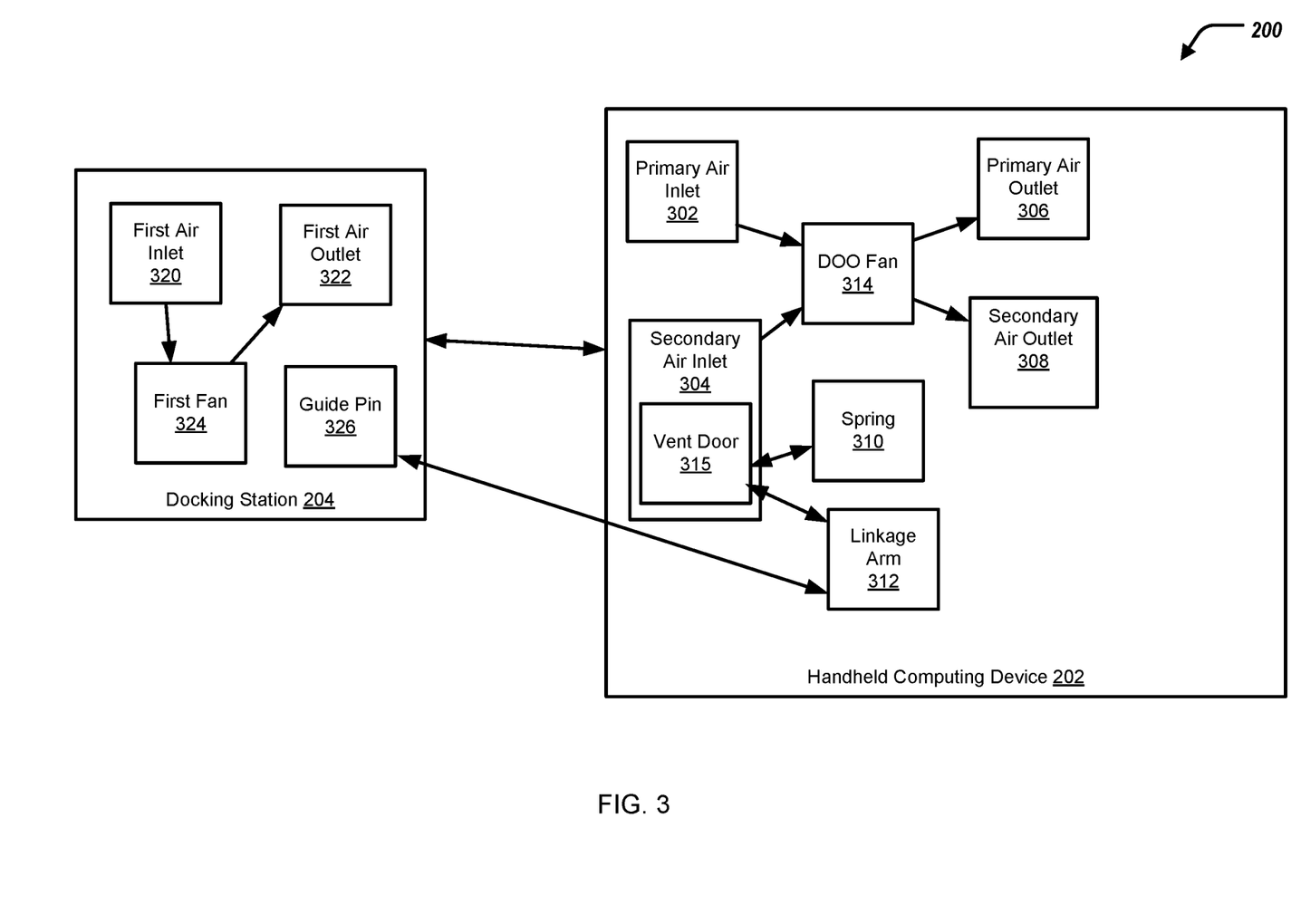
FIG. 3 illustrates a block diagram of the environment for thermal management of the handheld computing device.

FIG. 3 illustrates a block diagram of the environment 200 for thermal management of the handheld computing device 202. The handheld computing device 202 can include a primary air inlet 302, a secondary air inlet 304, a primary air outlet 306, a secondary air outlet 308, a spring 310, a linkage arm 312, and a dual opposite outlet (DOO) fan 314. The secondary air inlet 304 can further include a vent door 315.

The DOO fan 314 can be in thermal communication with the primary air inlet 302, the secondary air inlet 304, the primary air outlet 306, and the second air outlet 308.

The docking station 204 can include a first air inlet 320, a first air outlet 322, a first fan 324, and a guide pin 326. The first fan 324 can be in thermal communication with the first air inlet 320 and the first air outlet 322.

The handheld computing device 202 can be removably coupled with the docking station 204 (as shown in FIG. 2), described further herein. Further, when the handheld computing device 202 is coupled with the docking station 204, the guide pin 326 can be in mechanical contact with the linkage arm 312, described further herein.

Figure 4:
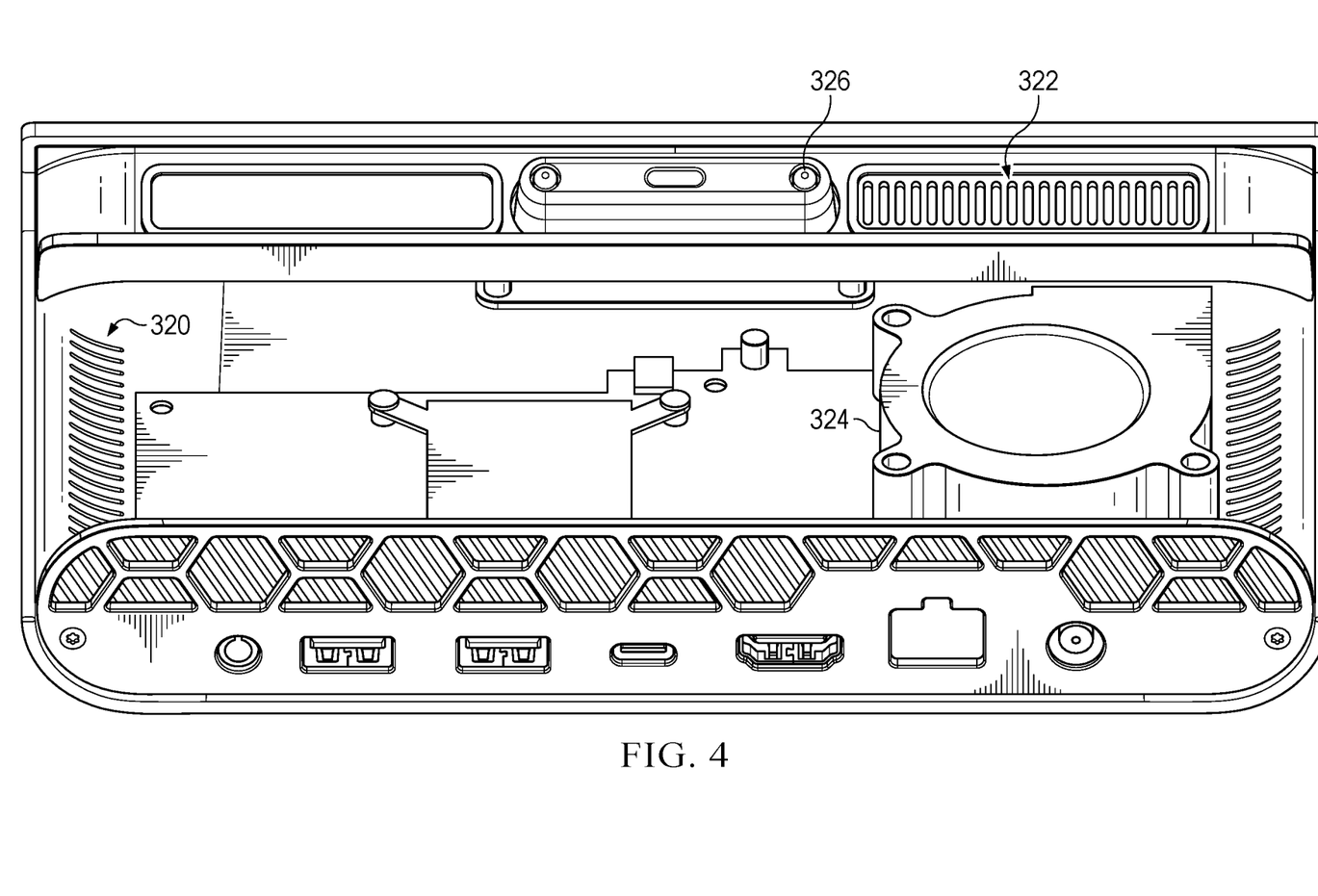
FIG. 4 illustrates a perspective partial see-thru view of the docking station.

FIG. 4 illustrates a perspective partial see-thru view of the docking station 204. The docking station 204 includes the first air inlet 320, the first air outlet 322, the first fan 324, and the guide pin 326. In some examples, the docking station 204 can include any number of air inlets and any number of air outlets.

Figure 5:
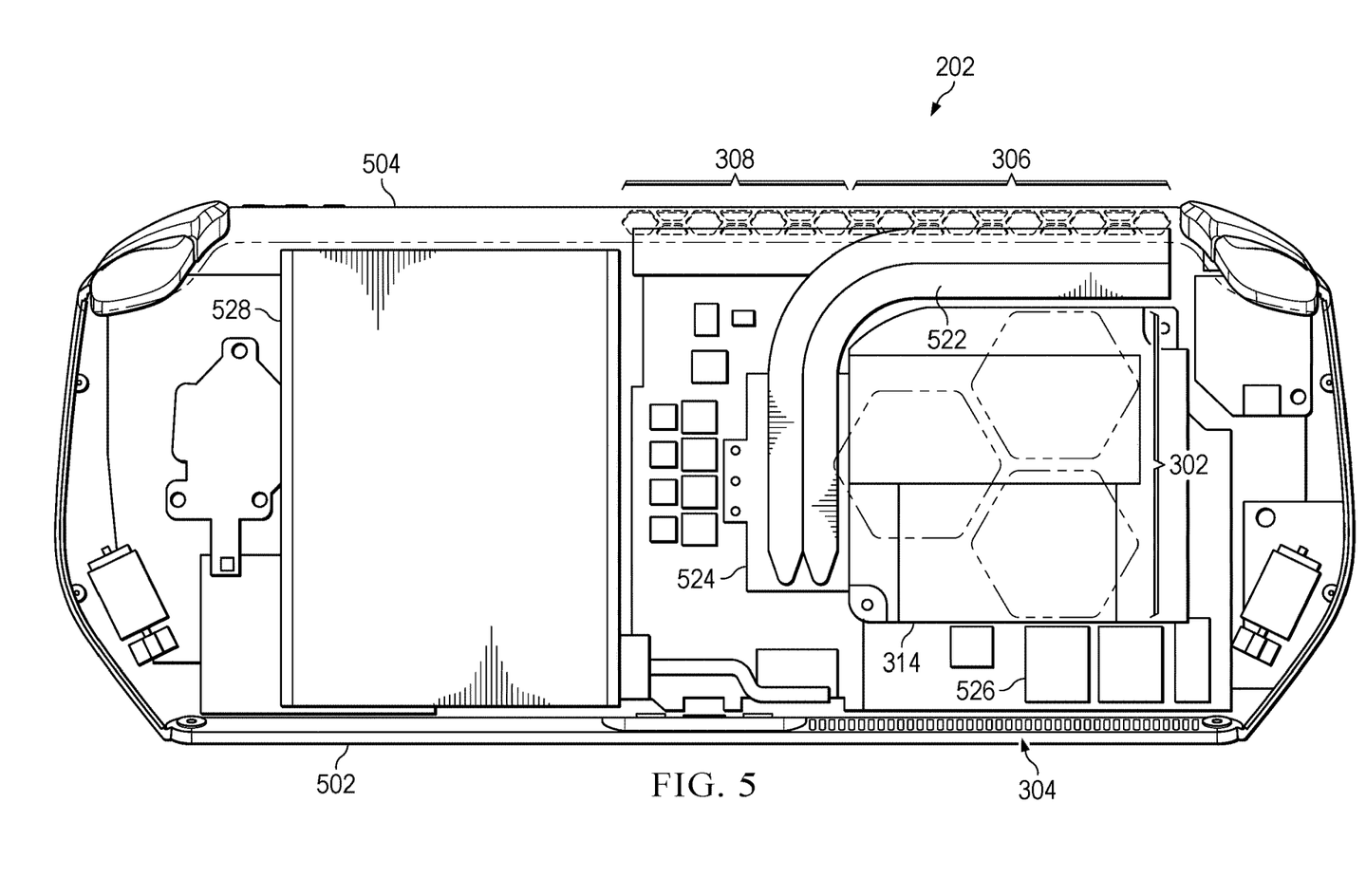
FIG. 5 illustrates a perspective partial see-thru view of the handheld computing device.

FIG. 5 illustrates a perspective partial see-thru view of the handheld computing device 202. The handheld computing device 202 is removably coupled to the docking station 204, described further herein. The handheld computing device 202 includes the primary air inlet 302, the secondary air inlet 304, the primary air outlet 306, the secondary air outlet 308, and the DOO fan 314. The secondary air inlet 304 can be positioned on a bottom side 502 of the handheld computing device 202. The primary air outlet 306 and the secondary air outlet 308 can be positioned on a top side 504 of the handheld computing device 202. The top side 504 of the handheld computing device 202 can be opposite to that of the bottom side 502 of the handheld computing device 202. The primary air inlet 302 can be positioned on a back side 506 of the handheld computing device (as shown in FIG. 2).

The handheld computing device 202 can further include a heat exchanger 522, a processor 524, memory 526, and a battery 528.

Figure 6:
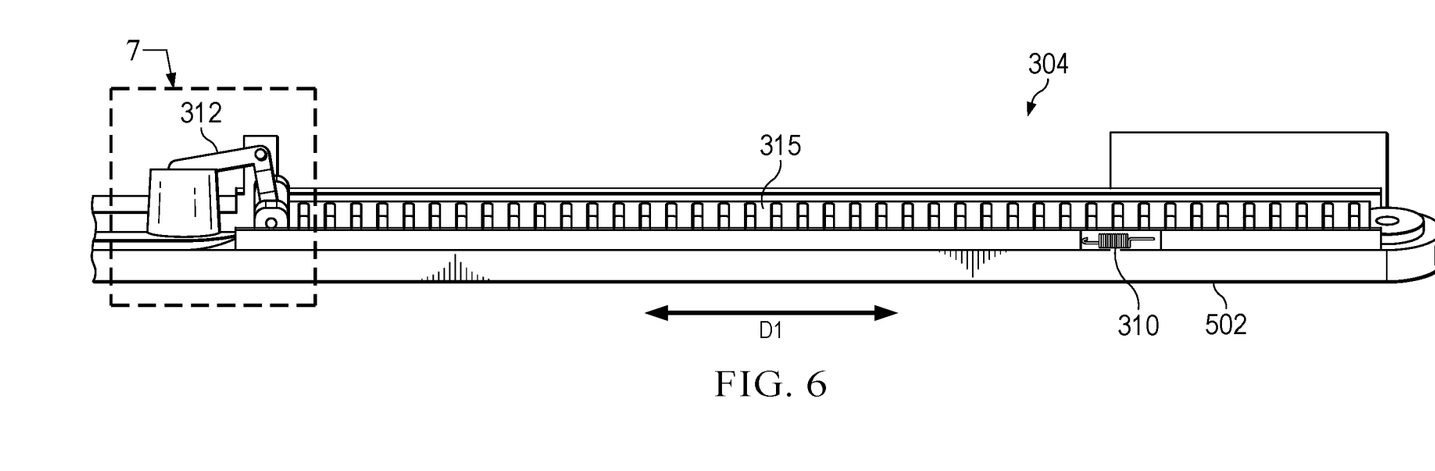
FIG. 6 illustrates a portion of the handheld computing device.

FIG. 6 illustrates a portion of the handheld computing device 202, and in particular, the secondary air inlet 304 of the handheld computing device 202. The handheld computing device 202, and in particular, the secondary air inlet 304, can further include the vent door 315. The vent door 315 can be slideably moveable about the direction DI, described further herein. The handheld computing device 202 can further include the spring 310 and the linkage arm 312.

Figure 7:
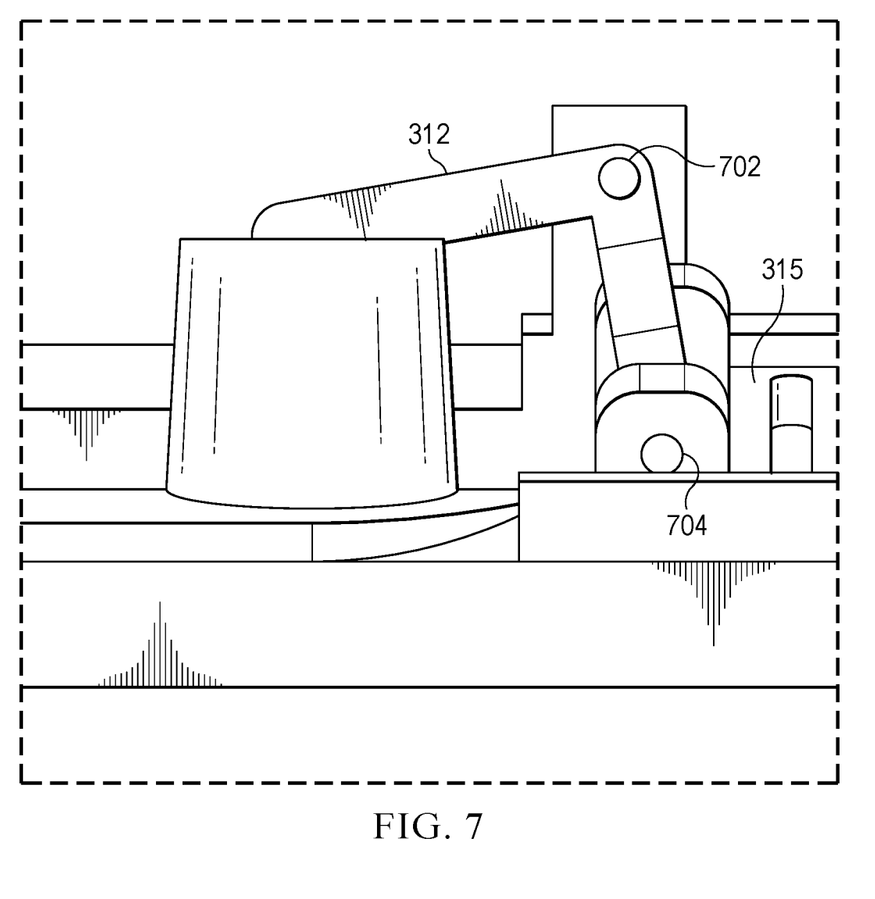
FIG. 7 illustrates a zoomed-in view of a portion of the handheld computing device.

FIG. 7 illustrates a zoomed-in view of a portion of the handheld computing device 202 shown in FIG. 6. The handheld computing device 302 can further include a fixed shaft 702. The linkage arm 312 can be coupled to the handheld computing device 202 at the fixed shaft 702. Further, the linkage arm 312 can be coupled to the vent door 315 at a pivot 704 of the vent door 315. The linkage arm 312 can rotate about the fixed shaft 704.

Figure 8:
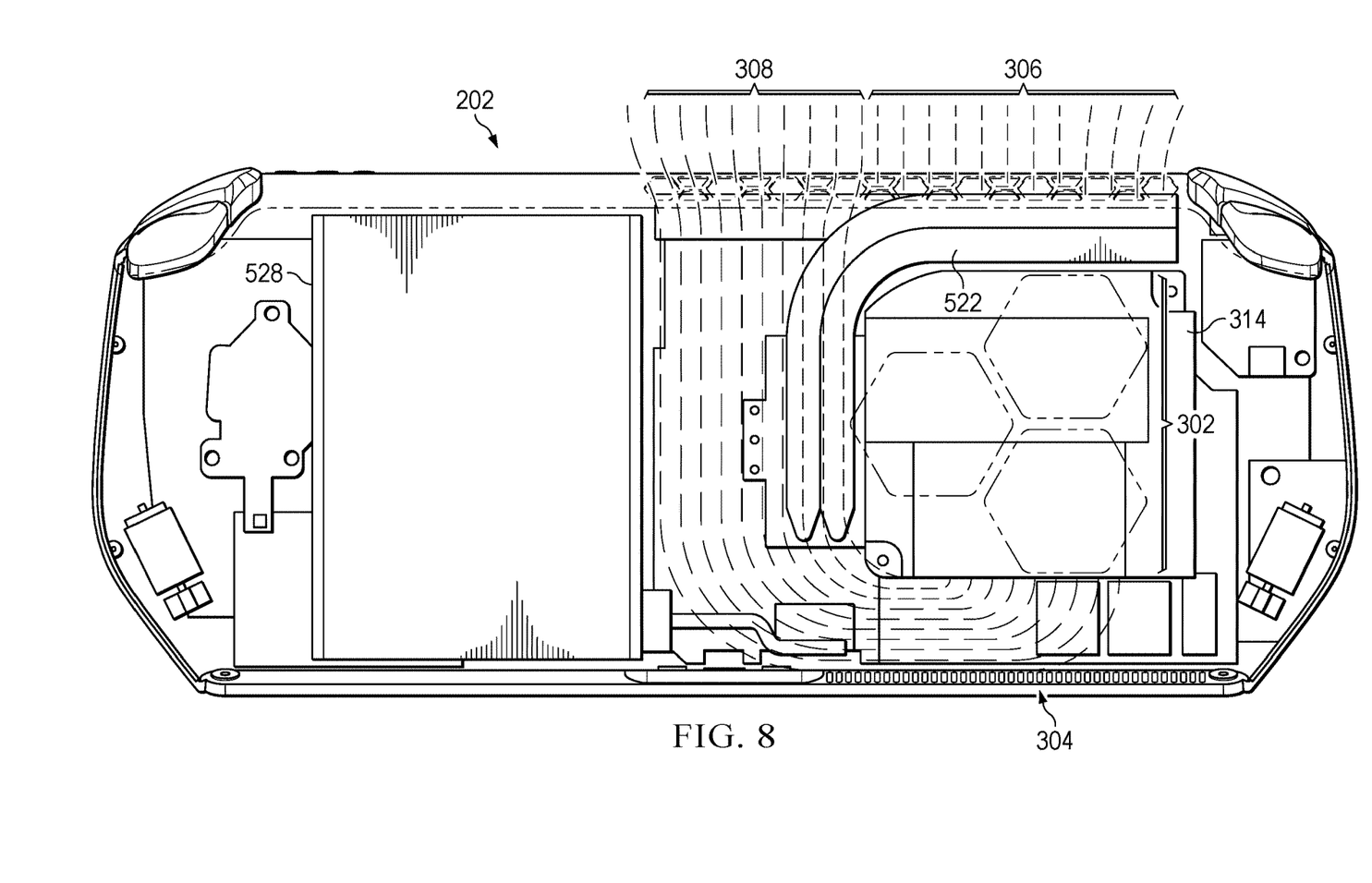
FIG. 8 illustrates the handheld computing device decoupled from the docking station.

FIG. 8 illustrates the handheld computing device 202 decoupled from the docking station 204. Referring to FIGS. 6 and 8, to that end, when the handheld computing device 202 is decoupled from the docking station 204, the secondary air inlet 304 is closed. Specifically, when the handheld computing device 202 is decoupled from the docking station 204, the vent door 315 is closed such that the secondary air inlet 304 is closed. That is, openings of the vent door 315 are not aligned with openings of the secondary air inlet 304.

The spring 310 can facilitate maintaining the vent door 315 closed. That is, the spring 310 maintains the vent door 602 in the closed positioned such that the secondary air inlet 304 is closed.

Further, when the handheld computing device 202 is decoupled from the docking station 204, the DOO fan 314 moves air from the primary air inlet 302 to the primary air outlet 306. Further, the DOO fan 314 moves air from the primary air inlet 302 to the primary air outlet 306 and across the heat exchanger 522, i.e., to remove heat from such air and providing cooling to the handheld computing device 302.

Moreover, when the handheld computing device 202 is decoupled from the docking station 204, the DOO fan 314 circulates air about the handheld computing device 302 and to the secondary air outlet 308. Specifically, as the secondary air inlet 304 is closed, the DOO fan 314 is able to circulate air about the computing components of the handheld computing device 302 (such as the processor 524, the memory 526, and the battery 528—shown more clearly in FIG. 5). Further, in some examples, the DOO fan 314 circulates at least a portion of the air about the handheld computing device 302 and to the secondary air outlet 308 and across the heat exchanger 522, i.e., to remove heat from such air and providing cooling to the handheld computing device 302 and the components of the handheld computing device 202, as well as reduce a skin temperature of the handheld computing device 202.

Figure 9:
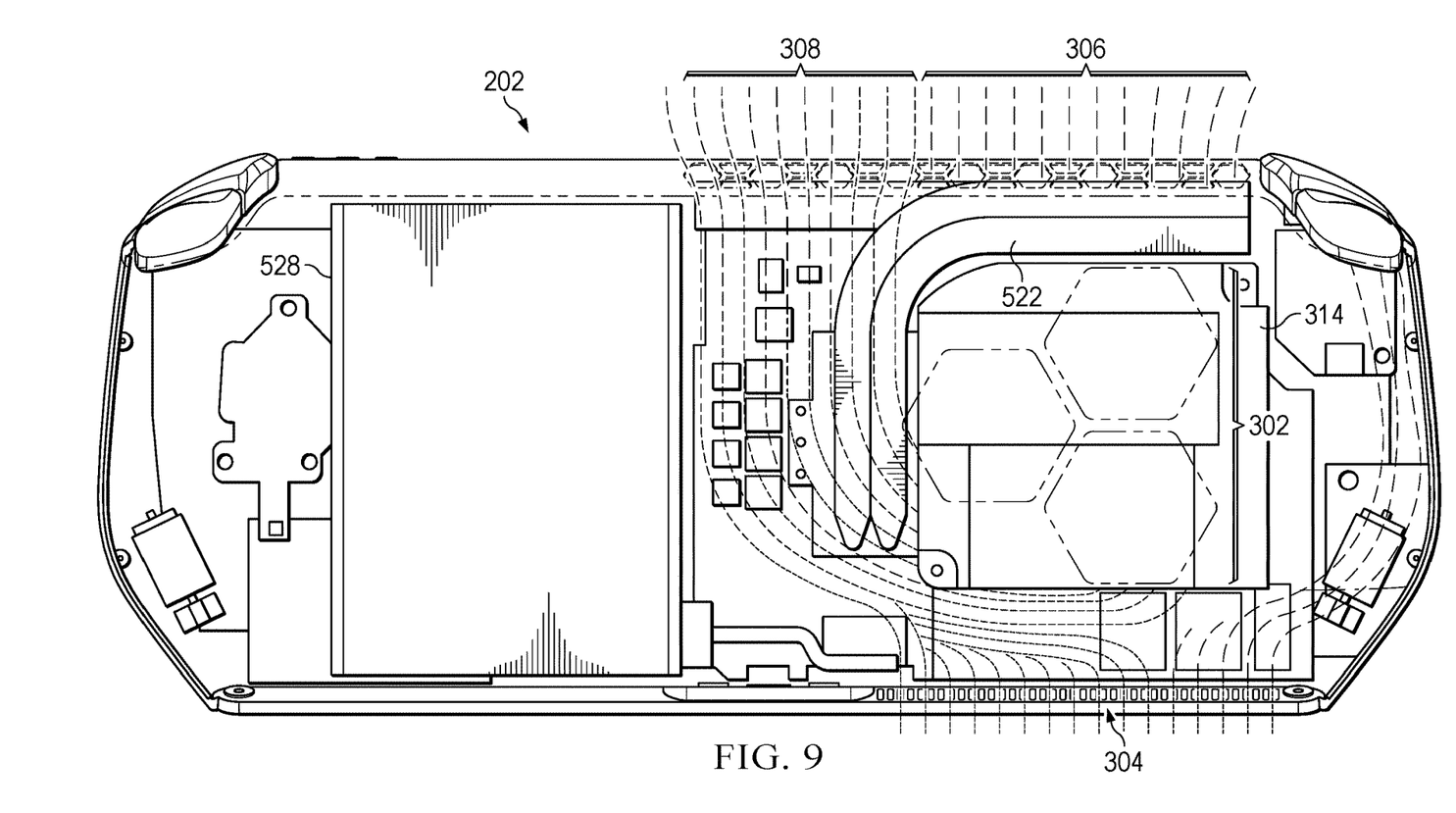
FIG. 9 illustrates the handheld computing device coupled to the docking station.

FIG. 9 illustrates the handheld computing device 202 when the handheld computing device 202 is coupled to the docking station 204. Referring to FIGS. 2 and 9, when the handheld computing device 202 is coupled to the docking station 204 (as shown in FIG. 2), the secondary air inlet 304 is open. Specifically, when the handheld computing device 202 is coupled to the docking station 204, the vent door 315 is open such that the secondary air inlet 304 is open, described further respect to FIGS. 10 and 11.

Figure 10:
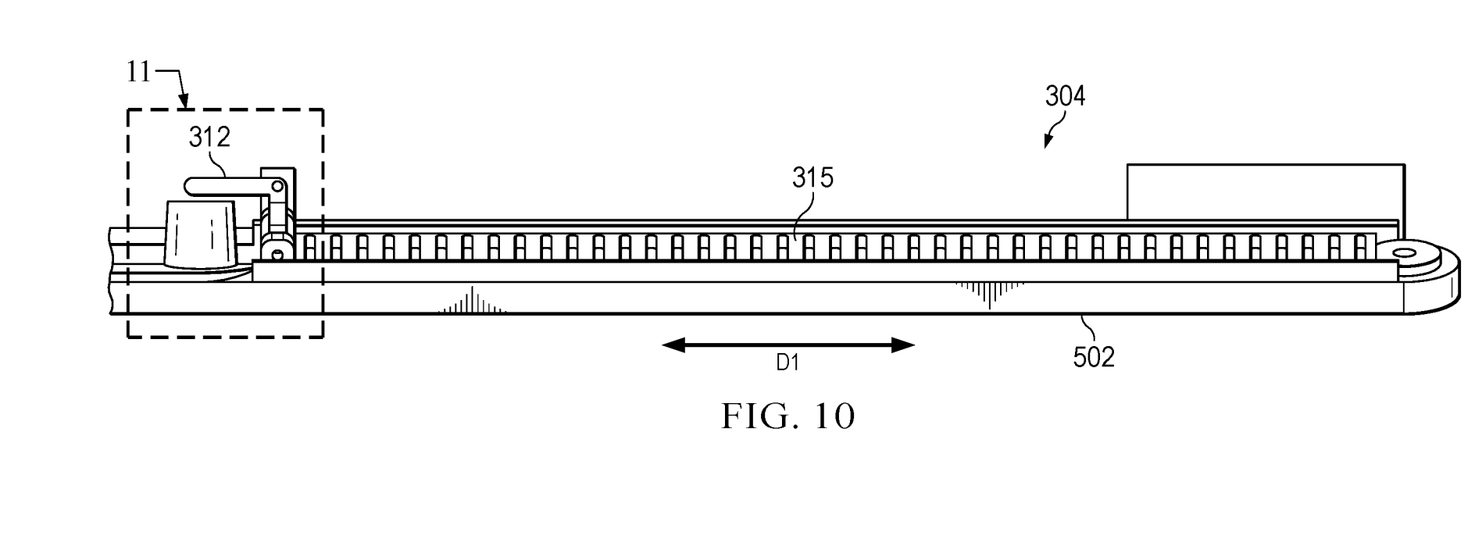
FIG. 10 illustrates a portion of the handheld computing device.
Figure 11:
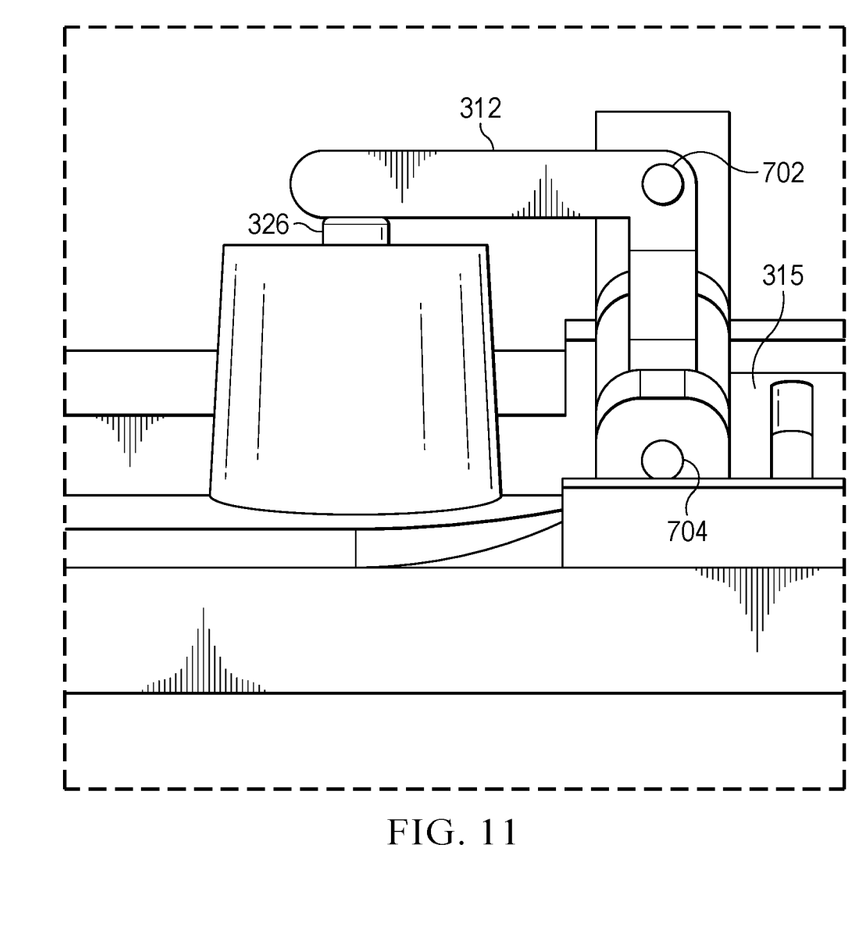
FIG. 11 illustrates a zoomed-in view of a portion of the handheld device.

FIG. 10 illustrates a portion of the handheld computing device 202, and in particular the secondary air inlet 304 of the handheld computing device 202 in an open state; and FIG. 11 illustrates a zoomed-in view of a portion of the handheld device 202, shown in FIG. 10. Referring to FIGS. 2, 9, 10, and 11, when the handheld computing device 202 is coupled to the docking station 204, the guide pin 326 contacts the linkage arm 312. When the guide pin 326 contacts the linkage arm 312, the guide pin 326 rotates the linkage arm 312 about the fixed shaft 702 to open the vent door 315. Specifically, the linkage arm 312 rotates about the fixed shaft 702 to translate the vent door 315 via the pivot 704 to open the vent door 315, and in particular, align the openings of the vent door 315 with the openings of the secondary air inlet 304. In other words, when the handheld computing device 202 is coupled to the docking station 204, upon such coupling, the guide pin 326 of the docking station 204 contacts the linkage arm 312 of the handheld computing device 312 to rotate the linkage arm 312 about the fixed shaft 702 to slide (or "pull") the vent door 315 to an open position such that openings of the vent door 315 are aligned with openings of the secondary air inlet 304. In some examples, the vent door 602 translates (or "moves" or is "pulled" or "travels") approximately 1 millimeter.

Referring to FIGS. 2, 4, and 9, further, when the handheld computing device 202 is coupled to the docking station 204, and the secondary air inlet 304 is open, the first fan 324 of the docking station 302 can ingress air into the handheld computing device 202. Specifically, when the handheld computing device 202 is coupled to the docking station 204, and the secondary air inlet 304 is open, the first fan 324 moves air from the first air inlet 320 of the docking station 204 to the first air outlet 322 of the docking station 204 and to the secondary air inlet 304 of the handheld computing device 202. Moreover, the first fan 324 further moves such air from the secondary air inlet 304 of the handheld computing device 202 to the secondary air outlet 308 of the handheld computing device 202. Further, the first fan 324 moves air from the secondary air inlet 304 to the secondary air outlet 308 and across the heat exchanger 522, i.e., to remove heat from such air and providing cooling to the handheld computing device 302.

Moreover, when the handheld computing device 202 is coupled with the docking station 204, the DOO fan 314 moves air from the primary air inlet 302 to the primary air outlet 306. Further, the DOO fan 314 moves air from the primary air inlet 302 to the primary air outlet 306 and across the heat exchanger 522, i.e., to remove heat from such air and providing cooling to the handheld computing device 302.

Additionally, when the handheld computing device 202 is coupled with the docking station 204, the DOO fan 314 circulates air about the handheld computing device 302 and to the secondary air outlet 308. Specifically, the DOO fan 314 is able to circulate air about the computing components of the handheld computing device 302 (such as the processor 524, the memory 526, and the battery 528—shown more clearly in FIG. 5). Further, in some examples, the DOO fan 314 circulates at least a portion of the air about the handheld computing device 302 and to the secondary air outlet 308 and across the heat exchanger 522, i.e., to remove heat from such air and providing cooling to the handheld computing device 302 and the components of the handheld computing device 202, as well as reduce skin temperatures of the handheld computing device 202.

The DOO fan 314 is able to circulate the air about the handheld computing device 302 and to the secondary air outlet 308 as a result of the air pressure of the air introduced to the secondary air inlet 304 by the first fan 324 of the docking station 324. Specifically, the DOO fan 314 circulates the air about the handheld computing device 302 and to the secondary air outlet 308 in parallel with the first fan 324 of the docking station 324 moving air from the secondary air inlet 304 to the secondary air outlet 308. That is, the air that is circulated by the DOO fan 314 is combined with the air moved by the first fan 324 from the secondary air inlet 304 to the secondary air outlet 308. Specifically, the pressure of the air moved by the first fan 324 from the secondary air inlet 304 to the secondary air outlet 308 is greater than the pressure of the air that is circulated by the DOO fan 314. In other words, the air that is moved by the first fan 324 is combined with the air that is circulated by the DOO fan 314 as a result of the pressure of the air that is moved by the first fan 324 being greater than the pressure of the air that is circulated by the DOO fan 314. As a result, the air that is moved by the DOO fan 314 does not egress from the secondary air inlet 304 and rather is circulated, and combined with the air that is moved by the first fan 324. Thus, the DOO fan 314 circulates the air about the handheld computing device 302 in parallel with the first fan 324 of the docking station 324 moving air from the secondary air inlet 304 to the secondary air outlet 308.

In some examples, the air pressure of the air that is moved by the first fan 324 from the secondary air inlet 304 to the secondary air outlet 308 can be approximately 0.3 inches $H_2O$.

In some examples, when the handheld computing device 202 is coupled with the docking station 204, the first fan 324 of the docking station 302 can additionally ingress air into the handheld computing device 202 from the first air inlet 320 of the docking station 204 to the first air outlet 322 of the docking station 204 and to the primary air inlet 302 of the handheld computing device 202.

When the handheld computing device 302 becomes uncoupled from the docking station 204, the spring 310 applies a force to the vent door 315 such that the vent door 315 is slid (or "pulled") to the closed position such that openings of the vent door 315 are not aligned with openings of the secondary air inlet 308.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A system for thermal management of a handheld computing device, including:
    a docking station, including:
        a first air inlet;
        a first air outlet;
        a first fan;
    the handheld computing device that is removably coupled to the docking station, including:
        a primary air outlet;
        a secondary air outlet;
        a primary air inlet;
        a secondary air inlet;
        a fan;
    wherein when the handheld computing device is decoupled from the docking station:
        the secondary air inlet is closed, and
        the fan i) moves air from the primary air inlet to the primary air outlet and ii) circulates air about the handheld computing device and to the secondary air outlet;
    wherein when the handheld computing device is coupled to the docking station:
        the secondary air inlet is open,
        the first fan moves i) air from the first air inlet to the first air outlet to the secondary air inlet and ii) from the secondary air inlet to the secondary air outlet, and
        the fan i) moves air from the primary air inlet to the primary air outlet and ii) circulates air about the handheld computing device and to the secondary air outlet.

2. The system of claim 1, wherein, when the handheld computing device is coupled to the docking station, the fan circulates the air about the handheld computing device and to the secondary air outlet in parallel with the first fan moving the air from the secondary air inlet to the secondary air outlet.

3. The system of claim 2, wherein, when the handheld computing device is coupled to the docking station, the air circulated by the fan is combined with the air moved by the first fan from the secondary air inlet to the secondary air outlet.

4. The system of claim 3, wherein, when the handheld computing device is coupled to the docking station, a pressure of the air moved by the first fan from the secondary air inlet to the secondary air outlet is greater than a pressure of the air that is circulated by the fan.

5. The system of claim 1, wherein the secondary air outlet of the handheld computing device further includes a vent door, wherein when the handheld computing device is decoupled from the docking station, the vent door is closed such that the secondary air inlet is closed, and wherein when the handheld computing device is coupled to the docking station, the vent door is open such that the secondary air inlet is open.

6. The system of claim 5, wherein the docking station further includes a guide pin and the handheld computing device further includes a linkage arm, wherein, when the handheld computing device is coupled to the docking station, the guide pin contacts the linkage arm to open the vent door.

7. The system of claim 6, wherein the linkage arm is coupled to the handheld computing device at a fixed shaft, and further coupled to the vent door at a pivot, wherein the linkage arm rotates about the fixed shaft.

8. The system of claim 7, wherein, when the handheld computing device is coupled to the docking station, the guide pin contacts the linkage arm to rotate the linkage arm about the fixed shaft to open the vent door.

9. The system of claim 8, wherein when the linkage arm rotates about the fixed shaft, the linkage arm translates the vent door via the pivot to open the vent door.

10. The system of claim 5, wherein the handheld computing device further includes a spring, wherein, when the handheld computing device is decoupled to the docking station, the spring maintains the vent door closed.

11. The system of claim 1, wherein the fan is a dual opposite outlet (DOO) fan.

12. A system for thermal management of a handheld computing device, including:
    a docking station, including:
        a first air inlet;
        a first air outlet;
        a first fan;
        a guide pin;
    the handheld computing device that is removably coupled to the docking station, including:
        a primary air outlet;
        a secondary air outlet including a vent door;
        a primary air inlet;
        a secondary air inlet;
        a fan;
        a linkage arm;
    wherein when the handheld computing device is coupled to the docking station:
        the guide pin contacts the linkage arm to open the vent door such that the secondary air inlet is open,
        the first fan moves i) air from the first air inlet to the first air outlet to the secondary air inlet and ii) from the secondary air inlet to the secondary air outlet, and
        the fan i) moves air from the primary air inlet to the primary air outlet and ii) circulates air about the handheld computing device and to the secondary air outlet.

13. The system of claim 12, the handheld computing device further includes a spring, wherein when the handheld computing device is decoupled from the docking station:
    the spring maintains the vent door closed such that the secondary air inlet is closed, and
    the fan i) moves air from the primary air inlet to the primary air outlet and ii) circulates air about the handheld computing device and to the secondary air outlet.

14. The system of claim 12, wherein, when the handheld computing device is coupled to the docking station, the fan circulates the air about the handheld computing device and to the secondary air outlet in parallel with the first fan moving the air from the secondary air inlet to the secondary air outlet.

15. The system of claim 14, wherein, when the handheld computing device is coupled to the docking station, the air circulated by the fan is combined with the air moved by the first fan from the secondary air inlet to the secondary air outlet.

16. The system of claim 14, wherein, when the handheld computing device is coupled to the docking station, a pressure of the air moved by the first fan from the secondary air inlet to the secondary air outlet is greater than a pressure of the air that is circulated by the fan.

17. The system of claim 12, wherein when the handheld computing device is decoupled from the docking station, the vent door is closed such that the secondary air inlet is closed.

18. The system of claim 11, wherein the handheld computing device further includes a linkage arm, wherein, when the handheld computing device is coupled to the docking station, the guide pin contacts the linkage arm to open the vent door.

19. The system of claim 18, wherein the linkage arm is coupled to the handheld computing device at a fixed shaft, and further coupled to the vent door at a pivot, wherein the linkage arm rotates about the fixed shaft.

20. A handheld computing device, comprising:
    a primary air outlet;
    a secondary air outlet including a vent door;
    a primary air inlet;
    a secondary air inlet;
    a fan;
    a spring; and
    a linkage arm,
    wherein when the handheld computing device is decoupled from a docking station:
        the spring maintains the vent door in a closed position such that the secondary air inlet is closed,
    wherein when the handheld computing device is coupled to the docking station:
        the linkage arm rotates to opens the vent door such that the secondary air inlet is open.

* * * * *